US010714510B2

(12) United States Patent
Cong et al.

(10) Patent No.: US 10,714,510 B2
(45) Date of Patent: Jul. 14, 2020

(54) ARRAY SUBSTRATE AND DISPLAY DEVICE

(71) Applicants: BOE TECHNOLOGY GROUP CO., LTD., Beijing (CN); ORDOS YUANSHENG OPTOELECTRONICS CO., LTD., Ordos, Inner Mongolia (CN)

(72) Inventors: Lele Cong, Beijing (CN); Jian Sun, Beijing (CN); Zhengkui Wang, Beijing (CN); Wenwen Qin, Beijing (CN); Jianjun Zhang, Beijing (CN)

(73) Assignees: BOE TECHNOLOGY GROUP CO., LTD., Beijing (CN); ORDOS YUANSHENG OPTOELECTRONICS CO., LTD., Ordos, Inner Mongolia (CN)

(*) Notice: Subject to any disclaimer, the term of this patent is extended or adjusted under 35 U.S.C. 154(b) by 0 days.

(21) Appl. No.: 16/201,771

(22) Filed: Nov. 27, 2018

(65) Prior Publication Data
US 2019/0189645 A1    Jun. 20, 2019

(30) Foreign Application Priority Data
Nov. 27, 2017   (CN) .......................... 2017 1 1209087

(51) Int. Cl.
*H01L 27/12* (2006.01)
(52) U.S. Cl.
CPC ........ *H01L 27/1244* (2013.01); *H01L 27/124* (2013.01); *H01L 27/1222* (2013.01)
(58) Field of Classification Search
CPC ............. H01L 27/3202; H01L 27/3204; H01L 27/3244; H01L 27/3262; H01L 27/3276;
(Continued)

(56) References Cited

U.S. PATENT DOCUMENTS 9,164,342 B2 * 10/2015 Moriwaki ........... G02F 1/13452
9,905,624 B2 * 2/2018 Udagawa ............ H01L 27/3276
(Continued)

FOREIGN PATENT DOCUMENTS

| CN | 106653796 A | 5/2017 |
| CN | 106716642 A | 5/2017 |
| CN | 106773424 A | 5/2017 |

OTHER PUBLICATIONS

First Office Action issued in corresponding Chinese Patent Application No. 201711209087.3, dated Nov. 14, 2019, with English translation.

*Primary Examiner* — Natalia A Gondarenko
(74) *Attorney, Agent, or Firm* — McDermott Will & Emery LLP

(57) ABSTRACT

An array substrate includes: a base substrate; at least one first connection terminal, at least one second connection terminal, and at least one connection line, which are disposed on the base substrate and located in a non-display area of the array substrate, the at least one connection line being connected with the at least one one first connection terminal and the at least one second connection terminal; at least one gate line disposed on the base substrate and located in a display area of the array substrate. The first connection terminal is for connecting with an IC, and the second connection terminal is for connecting with a flexible circuit board. A resistivity of at least a part of each of at least one of the at least one connection line is less than a resistivity of the at least one gate line.

15 Claims, 10 Drawing Sheets

(58) Field of Classification Search
CPC .............. H01L 27/3279; H01L 27/1218; H01L 27/124; H01L 27/1248; H01L 27/1244; H01L 27/1222; H01L 51/0097; H01L 51/0508; H01L 51/0541; H01L 51/055; H01L 51/50; H01L 2027/11879; H01L 2027/11875; H01L 2027/11885; H01L 2027/11896; H01L 2027/11898; H01L 2227/32; H01L 2251/50; H01L 2251/5338; H01L 2251/568; H01L 27/1214–1296; H01L 27/1255; H01L 27/32–3293; H01L 27/3297; H01L 2924/12044; H01L 2924/3512; H01L 2924/3511; H01L 2924/351; H01L 2924/386
USPC ...................................................... 257/72, 59
See application file for complete search history.

(56) References Cited

U.S. PATENT DOCUMENTS

| | | | |
|---|---|---|---|
| 10,162,235 B2 * | 12/2018 | Kimura | ............... G02F 1/13452 |
| 2001/0033355 A1 * | 10/2001 | Hagiwara | ............ G02F 1/13452 |
| | | | 349/152 |
| 2012/0044447 A1 * | 2/2012 | Yoshida | ............... G09G 3/3648 |
| | | | 349/139 |
| 2012/0138940 A1 | 6/2012 | Sato | |
| 2016/0020230 A1 * | 1/2016 | Lee | ....................... H01L 27/127 |
| | | | 257/43 |
| 2016/0093644 A1 | 3/2016 | Ki et al. | |
| 2017/0125505 A1 | 5/2017 | Oh | |
| 2019/0025659 A1 * | 1/2019 | Uchida | ............. G02F 1/136286 |

* cited by examiner

Burn out

ARRAY SUBSTRATE AND DISPLAY DEVICE

CROSS-REFERENCE TO RELATED APPLICATION

This application claims priority to Chinese Patent Application No. 201711209087.3, filed on Nov. 27, 2017, titled "AN ARRAY SUBSTRATE AND DISPLAY DEVICE", which is incorporated herein by reference in its entirety.

TECHNICAL FIELD

The present disclosure relates to the field of display technologies, and more particularly, to an array substrate and a display device.

BACKGROUND

With the rapid development of display technology, people's demanding for the working performance of display products is also increasing. However, with the continuous research and development of display products, the process of display products is becoming more and more complicated, and the accompanying defects are also increasing.

SUMMARY

In one aspect, an array substrate is provided. The array substrate includes a base substrate, at least one first connection terminal, at least one second connection terminal, at least one connection line, and at least one gate line. The at least one first connection terminal, the at least one second connection terminal, and the at least one connection line are disposed on the base substrate and located in a non-display area of the array substrate. The at least one connection line is connected with the at least one first connection terminal and the at least one second connection terminal. The at least one gate line is disposed on the base substrate and located in a display area of the array substrate. The at least one first connection terminal is configured to connect with an integrated circuit (IC), and the at least one second connection terminal is configured to connected with a flexible circuit board. A resistivity of at least a part of each of at least one of the at least one connection line is less than a resistivity of the at least one gate line.

In some embodiments, the array substrate further includes at least one first metal line which is disposed on the base substrate and located in the display area of the array substrate. A resistivity of the at least one first metal line is less than a resistivity of the at least one gate line. A material of the at least a part of each of at least one of the at least one connection line is the same as a material of the at least one first metal line.

In some embodiments, the at least a part of each of at least one of the at least one connection line and the at least one first metal line are disposed in a same layer and are made of a same material.

In some embodiments, each of the at least one connection line includes a first connection sub-line, a third connection sub-line and a second connection sub-line electrically connected in sequence. The first connection sub-line is electrically connected with corresponding first connection terminal(s) of the at least one first connection terminal, and the second connection sub-line is electrically connected with corresponding second connection terminal(s) of the at least one second connection terminal. The first connection sub-line, the second connection sub-line and the at least one gate line are disposed in a same layer, and are made of a same material. The third connection line and the at least one first metal line are disposed in a same layer, and are made of a same material. The at least one gate line is disposed close to the base substrate relative to the at least one first metal line. The array substrate further includes an insulating layer disposed between the first and second connection sub-line, and the third connection sub-line. The at least one first connection terminal, the at least one second connection terminal and the third connection sub-line are all located at a side of the insulating layer away from the base substrate, and the first connection sub-line and the second connection sub-line are both located at an opposite side of the insulating layer close to the base substrate. Each of the at least one first connection terminal is connected to a corresponding first connection sub-line by passing through at least one first via hole formed in the insulation layer, and each of the at least one second connection terminal is connected to a corresponding second connection sub-line by passing through at least one second via hole formed in the insulation layer. The third connection sub-line is connected to a corresponding first connection sub-line by passing through at least one third via hole formed in the insulation layer, and the third connection sub-line is connected to a corresponding second connection sub-line by passing through at least one fourth via hole formed in the insulation layer.

In some embodiments, the array substrate further includes at least one first thin film transistor disposed at a junction of the second connection sub-line and the third connection sub-line. A gate of each first thin film transistor is connected to a corresponding second connection sub-line, and a first electrode and a second electrode of each first thin film transistor are connected to a corresponding third connection sub-line.

In addition or alternatively, the array substrate further includes at least one second thin film transistor disposed at a junction of the first connection sub-line and the third connection sub-line. A gate of each second thin film transistor is connected to a corresponding first connection sub-line, and a first electrode and a second electrode of each second thin film transistor are connected to a corresponding third connection sub-line.

In some embodiments, a width to length ratio of each of at least one of the at least one first thin film transistor is 20:7.5.

In some embodiments, a width to length ratio of each of at least one of the at least one second thin film transistor is 20:7.5.

In some embodiments, the array substrate further includes at least one first connection strip disposed on the base substrate and located in the non-display area of the array substrate. The at least one second connection terminal comprises at least two second connection terminals. Each first connection strip is disposed between two adjacent second connection terminals that transmit a same signal among the at least two second connection terminals, and each first connection strip is in contact with both of corresponding two adjacent second connection terminals.

In addition or alternatively, the array substrate further includes at least one second connection strip disposed on the base substrate and located in the non-display area of the array substrate. The at least one first connection terminal comprises at least two first connection terminals. Each second connection strip is disposed between two adjacent first connection terminals that transmit a same signal among the at least two first connection terminals, and each second connection strip is in contact with both of corresponding two adjacent first connection terminals;

In some embodiments, in a case where the array substrate further includes the at least one first connection strip, each second connection terminal includes at least one layer in a thickness direction, and the at least one first connection strip and at least one layer of each second connection terminal are disposed in a same layer, and are made of a same material;

In addition or alternatively, in a case where the array substrate further includes the at least one second connection strip, each second connection terminal includes at least one layer in a thickness direction, and the at least one second connection strip and at least one layer of each first connection terminal are disposed in a same layer, and are made of a same material.

In some embodiments, at least one whole connection line of the at least one connection line, and the at least one first metal line are disposed in a same layer and are made of a same material.

In some embodiments, the array substrate further includes an insulating layer disposed on the base substrate and located in the non-display area. The at least one first connection terminal and the at least one second connection terminal are both located at a side of the insulation layer, and the at least one connection line is located at an opposite side of the insulation layer. Each of the at least one first connection terminal is connected to a corresponding connection line by passing through at least one fifth via hole formed in the insulation layer, and each of the at least one second connection terminal is connected to a corresponding connection line by passing through at least one sixth via hole formed in the insulation layer.

In some embodiments, the at least one first connection terminal and the at least one second connection terminal are both located at a side of the insulation layer away from the base substrate, and the at least one connection line is located at an opposite side of the insulation layer close to the base substrate.

In some embodiments, each first metal line is a data line or a common electrode line.

In some embodiments, each first metal line has a laminated structure, and includes at least two layers along a thickness direction. The at least two layers include a layer of Al, and a layer of Ti. A material of the gate line is Mo.

In some embodiments, each first metal line has a three-layer structure, a material of a middle layer of the three-layer structure is Al, and materials of two layers located at two sides of the middle layer are both Ti.

In another aspect, a display device is provided. The display device includes an IC, a flexible circuit board, and the array substrate described above. The IC is connected to the at least one first connection terminal of the array substrate, and the flexible circuit board is connected to the at least one second connection terminal of the array substrate.

BRIEF DESCRIPTION OF THE DRAWINGS

In order to describe technical solutions in embodiments of the present disclosure and the related art more clearly, the accompanying drawings to be used in the description of embodiments and the related art will be introduced briefly. Obviously, the accompanying drawings to be described below are merely some embodiments of the present disclosure, and a person of ordinary skill in the art can obtain other drawings according to those drawings without paying any creative effort.

DETAILED DESCRIPTION

To make the objectives, technical solutions and advantages of the embodiments of the present disclosure clear, the technical solutions in the embodiments of the present disclosure will be described clearly and completely with reference to the accompanying drawings in the embodiments of the present disclosure. Obviously, the described embodiments are merely some but not all of embodiments of the present disclosure. All other embodiments made on the basis of the embodiments of the present disclosure by a person of ordinary skill in the art without paying any creative effort shall be included in the protection scope of the present disclosure.

Figure 1:
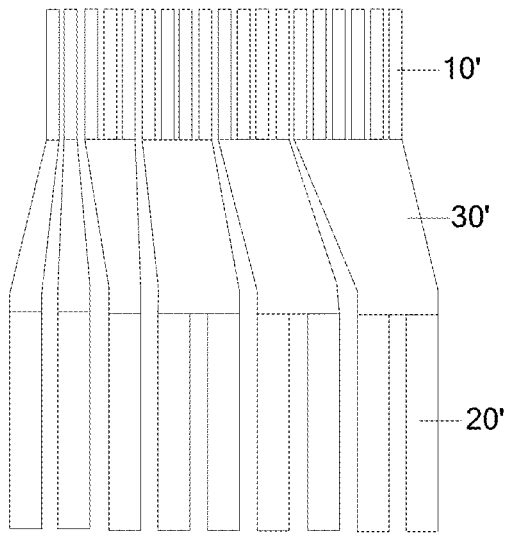
FIG. 1 is a schematic diagram illustrating a connection structure of first connection terminals, second connection terminals and connection lines in the related art.

In related art, as shown in FIG. 1, an array substrate 1A' in a display panel includes first connection terminals (PINs or Bonding PINs, which may also be referred to as pins, pin patterns or binding patterns, etc.) 10' connected to an IC (Integrated Circuit), and second connection terminals 20' connected to a FPC (Flexible Printed Circuit). First connection terminal(s) 10' and second connection terminal(s) 20' are connected via a connection line 30'.

Figure 2:
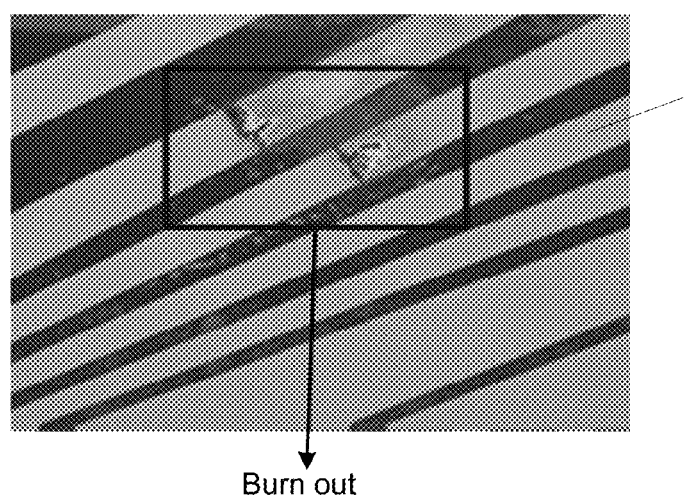
FIG. 2 is a schematic diagram illustrating that a connection line between a first connection terminal and a second connection terminal is burnt out in the related art.

In a case where a large current is input to the display panel, as shown in FIG. 2, a burnout phenomenon usually occurs to the connection line 30', causing the connection line 30' to break (i.e., burn out), thereby seriously affecting the normal display of the display panel.

Figure 3:
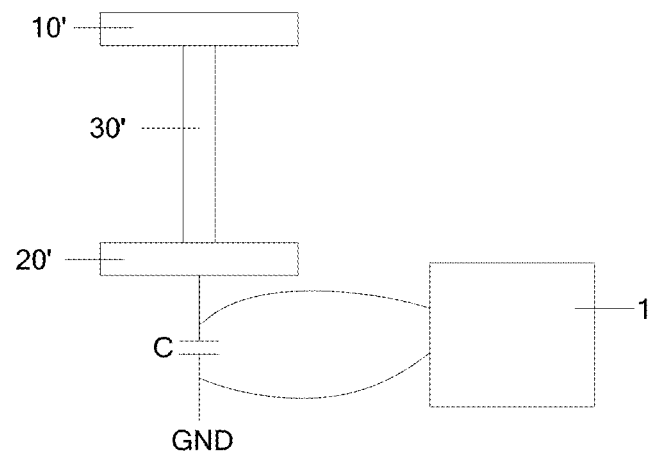
FIG. 3 is a schematic diagram of a limit test of a large current in a connection line in the related art.

In the related art, as shown in FIG. 3, a first connection terminal 10' connected to the IC and a second connection terminal 20' connected to the FPC are connected via a connection line 30'. To simplify the fabricating process, gate lines and connection lines 30' in the array substrate 1A' are usually fabricated under the same fabricating process, thus the connection lines 30' and the gate lines are disposed in a same layer and are made of a same material.

In the related art, in order to achieve a better display effect, a resistivity of a material for fabricating the gate lines is generally very large, and thus a material for fabricating the connection lines 30' has a large resistivity. In this case, when a large current is input to the display panel, the connection line 30' is often burnt out while transmitting a large current.

According to the design of the related art, when a product designed according to the related art is tested, the display panel displays an abnormality. After analysis, the abnormality is caused by a connection line burn-out. The reason why the connection line is burnt out is that a module lighting device which tests the display panel inputs an abnormally large current to the display panel, which causes the connection line or the second connection terminal to generate heat, thereby causing the connection line to be burnt out.

Signals that are prone to appear an abnormality in the signals output from the module lighting device are VSP (Voltage Drive-screen Positive), VSN (Voltage Drive-screen Negative), and VGH (Voltage Gate Higher). By simulating the three signals of VSP, VSN and VGH with a large current/a high voltage, a critical voltage value (i.e., line-burnt voltage) and a critical current value (i.e., line-burnt current) when the connection line is burnt out can be obtained.

FIG. 3 is a schematic diagram of a test when a limit large current is transmitted through the connection line 30'. A digital power supply 1 is used to apply a voltage across a capacitor (marked as "C" in FIG. 3), which is disposed on the FPC and have different capacitance when the signals VSP, VSN, and VGH are transmitted, and the current increases gradually as the voltage increases. When the connection line 30' is burnt out, the current through the connection line 30' can be considered as being reduced to 0 instantaneously, and the voltage and current obtained before the connection line 30' is instantaneously burnt out are the line-burnt voltage and line-burnt current respectively.

The following Table 1 provided blow is a summary of the critical values of line-burnt voltages and line-burnt currents obtained from tests performed on products in the related art. Normal voltages and normal currents in Table 1 are respectively voltages and currents required for normal operation of the display panel. Since a normal current value at the time of transmitting a VGH signal cannot be tested, it is not given in Table 1. The symbol "-" in Table 1 means that the normal current value at the time of transmitting a VGH signal is not tested.

TABLE 1

Summary of critical values of the line-burnt voltages and line-burnt currents when various signals are transmitted

| Signal type | Signal line width | Normal voltage | Line-burnt voltage | Normal current | Line-burnt current |
|---|---|---|---|---|---|
| VSP | 0.07 mm | 5.0 V | 12.57 V | 13 mA | 174 mA |
| VSN | 0.07 mm | −5.0 V | 12.28 V | 6 mA | 154 mA |
| VGH | 0.07 mm | 8 V | 20.7 V | — | 176 mA |

It can be seen from Table 1 that if an instantaneously increased large current is applied to the display panel due to an abnormality of module lighting device or an abnormality of reliability, it will cause the connection line to be burnt out. The reliability here refers to the performance of the display panel indicating whether the display panel can maintain normal operation in a limit environment such as high temperature, high humidity or low temperature, and the abnormality of reliability means that the display panel works abnormally in an extreme environment. The above test shows that the burnout current of the connection line is about 170 mA.

Figure 4:
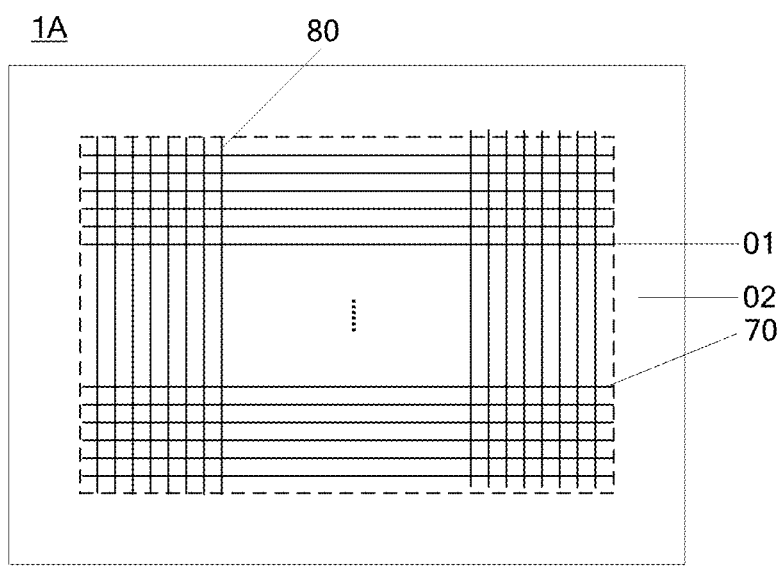
FIG. 4 is a schematic structure diagram of a display region and a non-display region of an array substrate according to some embodiments of the present disclosure.
Figure 5:
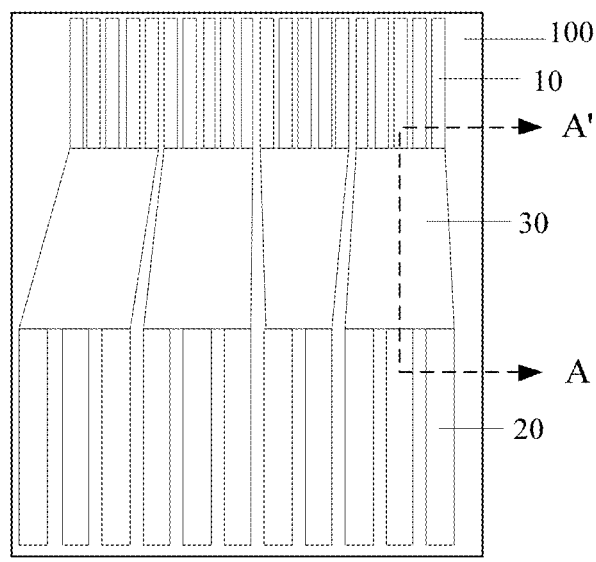
FIG. 5 is a schematic diagram illustrating a connection structure of first connection terminals, second connection terminals and connection lines according to some embodiments of the present disclosure.

Some embodiments of the present disclosure provide an array substrate 1A. As shown in FIG. 4 and FIG. 5, the array substrate 1A includes a base substrate 100. In addition, the array substrate 1A includes at least one first connection terminal 10, at least one second connection terminal 20, and at least one connection line 30, which are disposed on the base substrate 100 and located in a non-display area 02 of the array substrate 1A. The at least one connection line 30 is connected with the at least one first connection terminal 10 and the at least one second connection terminal 20.

Figure 11:
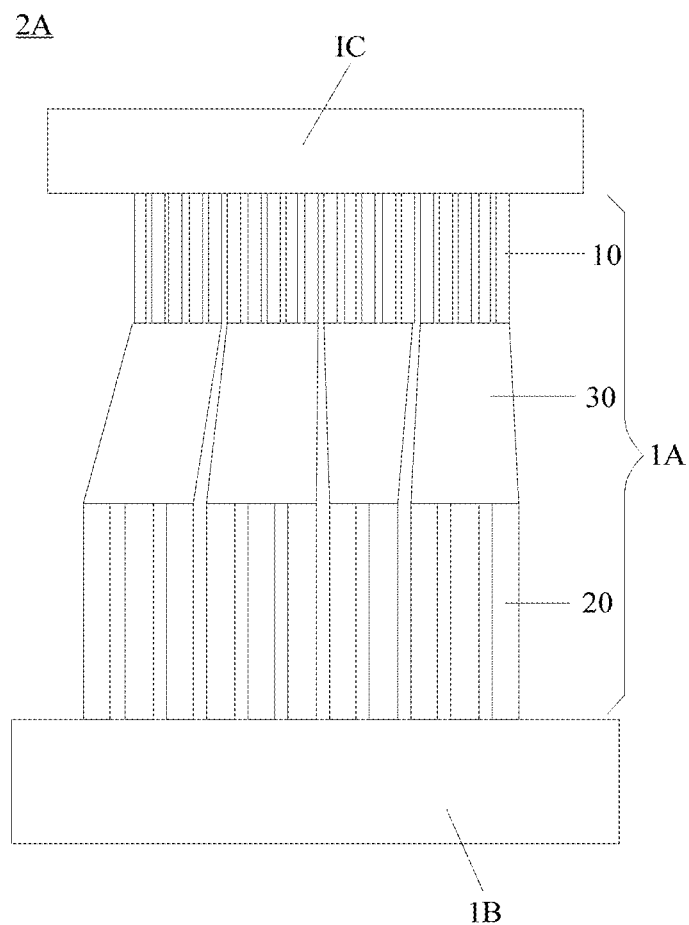
FIG. 11 is a schematic structure diagram of a display device according to some embodiments of the present disclosure.

As shown in FIG. 11, the at least one first connection terminal is configured to connect with an IC, and the at least one second connection terminal is configured to connect with a flexible circuit board 1B.

The array substrate 1A further includes at least one gate line 70 disposed on the base substrate 100 and located in a display area 01 of the array substrate 1A. A resistivity of at least a part of each of at least one of the at least one connection line 30 is less than a resistivity of the at least one gate line 70.

A heating power of a material is related to a resistivity of the material, and the higher the resistivity is, the greater the heating power is. In this way, since the resistivity of at least a part of each of at least one of the at least one connection line 30 is less than the resistivity of the at least one gate line 70, the heating power of the at least a part of each of at least one of the at least one connection line 30 is less than the heating power of the at least one gate line 70. In some examples, for any one of the at least one connection line 30, the resistivity of the whole connection line 30 is less than the resistivity of the at least one gate line 70.

Exemplarily, one connection line 30 is connected to one first connection terminal 10. Alternatively, one connection line 30 is connected to two or more first connection terminals 10. Exemplarily, one connection line 30 is connected to one second connection terminal 20. Alternatively, one connection line 30 is connected to two or more second connection terminals 20. The connection structure of the connection line 30 and the first connection terminal 10 and the connection structure of the connection line 30 and the second connection terminal 20 are not limited in herein, and they can be set according to the design requirements of the array substrate.

In the array substrate 1A according to the embodiments of the present disclosure, at least one first connection terminal 10 and at least one second connection terminal 20 are connected to at least one connection line 30. Since the resistivity of at least a part of each of at least one of the at least one connection line 30 is less than the resistivity of the gate line 70 located in the display region 01, the heating power of the at least a part of each of at least one of the at least one connection line 30 is less than the heating power of the gate line 70. In this way, when a large current flows through the at least one connection line 30, compared with the related art in which the connection line 30 and the gate line are disposed in a same layer and are made of a same material, in the array substrate 1A according to the embodiments of the present disclosure, the resistivity of at least a part of each of at least one of the at least one connection line 30 is less than the resistivity of the gate line 70, and thus the at least a part of each of at least one of the at least one connection line 30 has a lower heating power, which reduces the risk of the burning of the at least one connection line 30 when a large current flows through it.

In some embodiments, as shown in FIG. 4, the array substrate 1A further includes at least one first metal line 80 disposed on the base substrate and located in the display area 01 of the array substrate 1A. A resistivity of the at least one first metal line 80 is less than the resistivity of the at least one gate line 70, and a material of the at least a part of each of at least one of the at least one connection line 30 is the same as a material of the at least one first metal line.

Since the resistivity of the at least one first metal line 80 is less than the resistivity of the at least one gate line 70, in the case that other conditions are the same (i.e., the same wiring width and the same wiring length), a heating power of the first metal line 80 is less than a heating power of the gate line 70.

Type of the at least one first metal line 80 located in the display region 01 is not limited herein, as long as the resistivity of the at least one first metal line 80 is less than the resistivity of the at least one gate line 70.

Exemplarily, the first metal line 80 is a data line or a common electrode line.

The embodiments of the present disclosure are described below by taking an example in which the first metal line 80 is a data line. Generally, a resistivity of the gate line is 0.4 Ω·m, and a resistivity of the data line is 0.06 Ω·m. The resistivity of the gate line is significantly greater than the resistivity of the data line.

For ease of fabrication, in some embodiments, at least a part of each of at least one of the at least one connection line 30 and the at least one first metal line 80 are disposed in a same layer and are made of a same material. The so-called "disposed in a same layer" is directed to at least two patterns (for example, the at least one connection line 30 and the at least one first metal line 80 in the embodiments of the present disclosure), meaning that the at least two patterns are set in a same film layer.

Exemplarily, the at least two patterns disposed in a same layer are formed by patterning a film via a single patterning process.

In some examples, for any one of the at least one connection line 30, the entire connection line 30 and the at least one first metal line 80 are disposed in a same layer and made of a same material. Alternatively, for any one of the at least one connection line 30, a part of the at least one connection line 30 and the at least one first metal line are disposed in a same layer and made of a same material.

Here, the part of each of the at least one connection line 30 that is disposed in a same layer and made of a same material as the at least one first metal line may be formed in a same patterning process as the at least one first metal line 80.

In this way, under the condition of a same wiring width and a same wiring length, when the critical burnout current of the connection line 30 is about 170 mA, the resistivity of the gate line is 0.4 Ω·m, and the resistivity of the data line is 0.06 Ω·m, the entire connection line 30 and the first metal line 80 (e.g. a data line) are disposed in a same layer and are made of a same material (by contrast, in the related art, the connection line 30 and the gate line are disposed in a same layer and are made of a same material), so the above array substrate in the embodiments of the present disclosure may enable the heating power of the entire connection line 30 to be reduced to 0.15 times of the heating power of the connection line in the related art, thereby reducing the burnout possibility of the connection line 30 by a large current.

The material of the first metal line 80 and the material of the gate line 70 are not limited herein, as long as the resistivity of the first metal line 80 is less than the resistivity of the gate line 70.

In some embodiments, each of the at least one first metal line 80 has a laminated structure, and includes at least two layers along a thickness direction. The at least two layers include a layer of Al and a layer of Ti. The gate line 70 is made of Mo.

Exemplarily, each of the at least one first metal line 80 has a three-layer structure, a material of a middle layer of the three-layer structure is Al, and materials of two layers thereof located at two sides of the middle layer are both Ti, that is, materials at both sides of the middle layer are both Ti. The material of the gate line 70 is Mo.

In some embodiments, the at least one connection line 30 are entirely disposed in a same layer and are made of a same material as the at least one first metal line.

In this way, the at least one connection line 30 and the at least one first metal line may be fabricated in a single patterning process, thereby simplifying the fabricating process of the array substrate.

Figure 6:
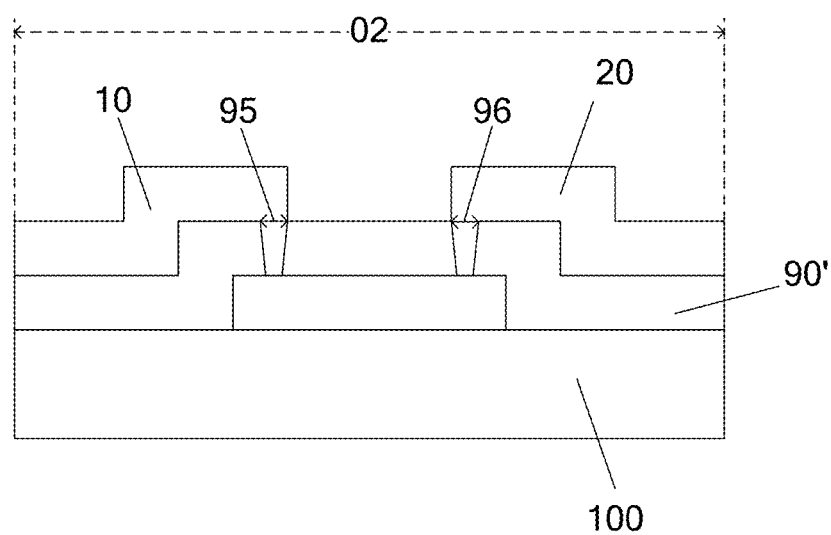
FIG. 6 is a sectional view of FIG. 5 along an A-A' direction.

In some embodiments, as shown in FIG. 6, the array substrate 1A further includes an insulating layer 90' disposed on the base substrate 100 and located in the non-display area 02. The at least one first connection terminal 10 and the at least one second connection terminal 20 are both disposed at one side of the insulating layer 90', and the at least one connection line 30 is disposed at an opposite side of the insulating layer 90'. Each of the at least one first connection terminal 10 is connected to a corresponding connection line 30 by passing through at least one fifth via hole 95 formed in the insulation layer 90', and each of the at least one second connection terminal 20 is connected to a corresponding connection line 30 by passing through at least one sixth via hole 96 formed in the insulation layer 90'.

Here, the entire connection line 30 and the first metal line 80 are disposed in a same layer and are made of a same material. When the first metal line 80 is one layer, the entire connection line 30 is also one layer, that is, the material of the entire connection line 30 is all the same. When the first metal line 80 includes at least two layers, the entire connection line 30 also includes at least two layers, that is, each layer of the entire connection line 30 is made of a same material as a corresponding layer of the first metal line 80.

In some examples, the insulating layer between the at least one first connection terminal 10, the at least one second connection terminal 20, and the at least one connection line 30 is fabricated simultaneously with an insulating layer of the display region. Alternatively, the insulating layer between the at least one first connection terminal 10, the at least one second connection terminal 20, and the at least one connection line 30 is separately fabricated.

Taking the first metal line 80 being a data line as an example, since the gate line 70 and the data line are usually arranged in a cross manner, in order to avoid confusion between the signal transmitted on the data line and the signal transmitted on the gate line, in some embodiments, an insulating isolation layer is provided between the data line and the gate line. In some examples, the insulating layer between the first connection terminal 10, the second connection terminal 20, and the connection line 30 is simultaneously fabricated with the insulating isolation layer between the gate line and the data line, and the insulating layer between the first connection terminal 10, the second connection terminal 20 and the connection line 30 and the insulating isolation layer between the gate line and the data line are a whole layer.

Since each of the at least one first connection terminal 10 is connected with a corresponding connection line 30 by passing through the at least one fifth via hole 95 formed in the insulation layer 90', and each of the at least one second connection terminal 20 is connected with a corresponding connection line 30 by passing through the at least one sixth via hole 96 formed in the insulation layer 90', an offset of the first connection terminal 10 and the second connection terminal 20 may be avoided when they are connected with the corresponding connection line 30. Thus, signals may be transmitted normally between the first connection terminal 10 and a corresponding second connection terminal 20.

Therefore, as shown in FIG. 6, the at least one first connection terminal 10 and the at least one second connection terminal 20 are both disposed at a side of the insulating layer 90' away from the base substrate 100, and the at least one connection line 30 is disposed at an opposite side of the insulating layer 90' close to the base substrate 100. That is, the at least one first connection terminal 10 and the at least one second connection terminal 20 are both disposed on the insulating layer 90', and the at least one connection line 30 is located beneath the insulating layer 90', so as to expose the at least one first connection terminal 10 and the at least one second terminal 20, and be convenient for the connection between the at least one first connection terminal 10 and the IC, and the connection between the at least one second connection terminal 20 and the flexible circuit board.

When the gate line 70 is disposed close to the base substrate 100 with respect to the first metal line 80, that is, when the first metal line 80 is located above the gate line 70, if the entire connection line 30 and the first metal line 80 are disposed in a same layer and are made of a same material, then the connection line 30 is also located above the gate line 70. At least one of the first connection terminal 10 and the second connection terminal 20 is usually disposed in a same layer as the first metal line 80, that is, the connection line 30 and at least one of the first connection terminal 10 and the second connection terminal 20 are both located above the gate line 70. Therefore, an offset is easily generated when at least one of the first connection terminal 10 and the second connection terminal 20 is connected to a corresponding connection line 30. Consequently, at least one of the first connection terminal 10 and the second connection terminal 20 is not connected to the corresponding connection line 30, but connected to another adjacent connection line 30, causing an abnormality in signal input and then a display abnormality.

Figure 7A:
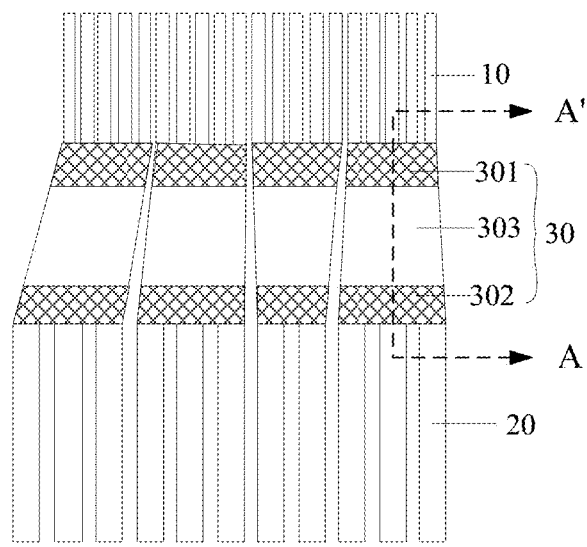
FIG. 7(a) is a schematic diagram illustrating another connection structure of first connection terminals, second connection terminals and connection lines according to some embodiments of the present disclosure.

Therefore, in some embodiments, as shown in FIG. 7(a), each of the at least one connection line 30 includes a first connection sub-line 301, a third connection sub-line 303 and a second connection sub-line 302 electrically connected in sequence. The first connection sub-line 301 is electrically connected with corresponding first connection terminal(s) of the at least one first connection terminal 10, and the second connection sub-line 302 is electrically connected with corresponding second connection terminal(s) of the at least one second connection terminal 20. The first connection sub-line 301, the second connection sub-line 302 and the at least one gate line 70 are disposed in a same layer, and are made of a same material. The third connection sub-line 303 and the at least one first metal line 80 are disposed in a same layer, and are made of a same material. The at least one gate line 70 is disposed close to the base substrate 100 relative to the at least one first metal line 80.

The first connection sub-line 301, the second connection sub-line 302 and the at least one gate line 70 are disposed in a same layer and are made of a same material, and thus, the first connection sub-line 301, the second connection sub-line 302, and the at least one gate line 70 may be formed via a single patterning process. Similarly, the third connection sub-line 303 and the at least one first metal line 80 are disposed in a same layer and are made of a same material, and thus, the third connection sub-line 303 and the at least one first metal line 80 may be formed via a single patterning process, so as to simplify the fabricating process of the array substrate 1A.

Since the at least one gate line 70 is disposed close to the base substrate 100 relative to the at least one first metal line 80, that is, the at least one gate line 70 and the at least one first metal line 80 are disposed in different layers, in order to prevent the at least one first metal line 80 and the at least one gate line 70 from affecting each other, in some embodiments, an insulating layer is disposed between the at least one first metal line 80 and the at least one gate line 70.

Figure 7B:
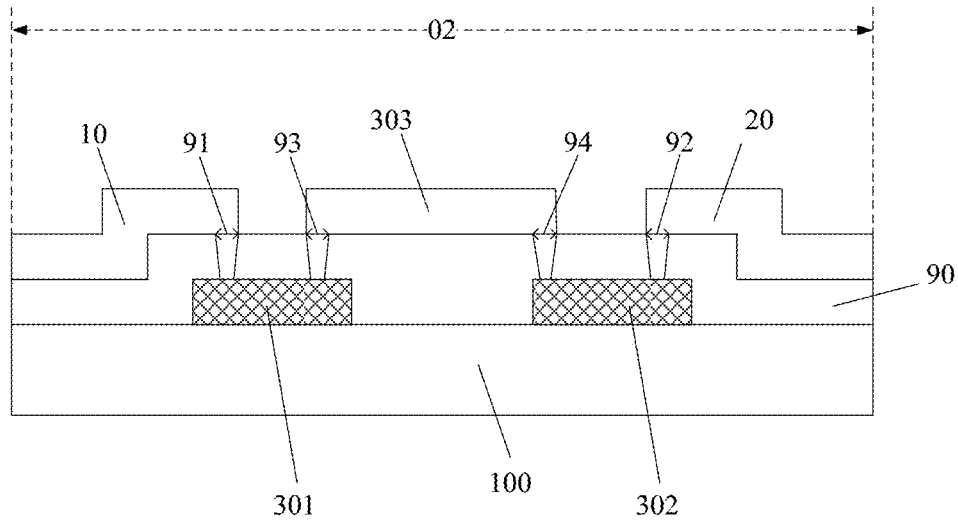
FIG. 7(b) is a sectional view of FIG. 7(a) along an A-A' direction.
Figure 8A:
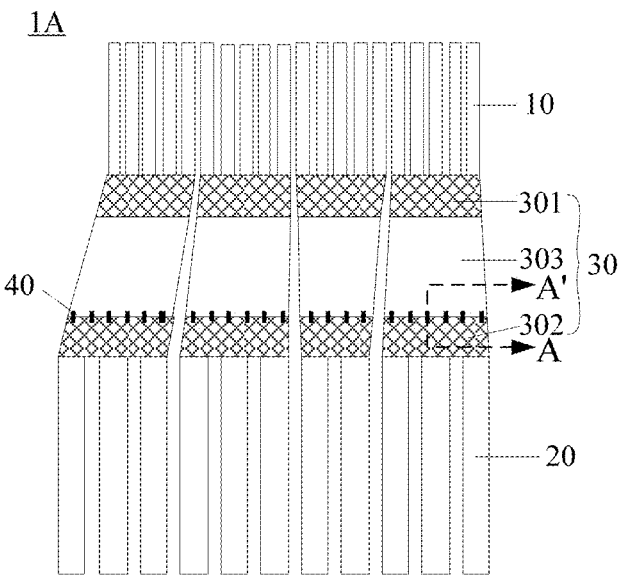
FIG. 8(a) is a schematic diagram illustrating still another connection structure of first connection terminals, second connection terminals and connection lines according to some embodiments of the present disclosure.
Figure 8B:
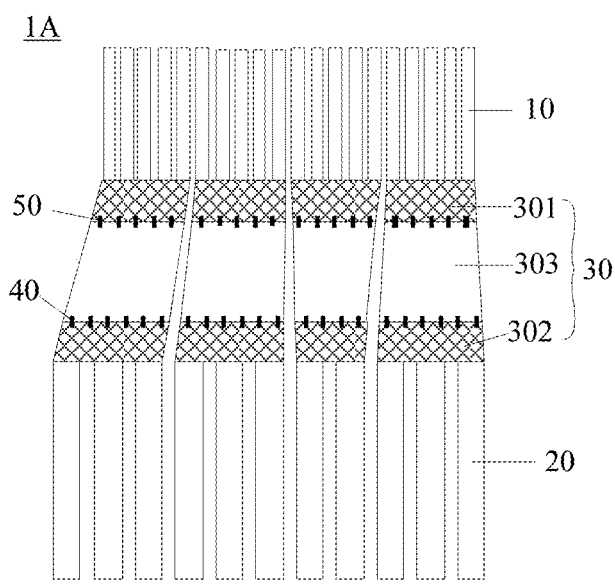
FIG. 8(b) is a schematic diagram illustrating yet still another connection structure of first connection terminals, second connection terminals and connection lines according to some embodiments of the present disclosure.
Figure 8C:
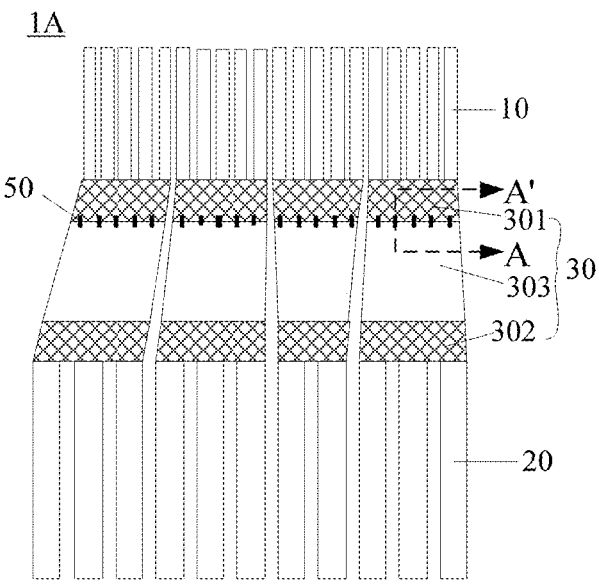
FIG. 8(c) is a schematic structure diagram illustrating yet still another connection structure of first connection terminals, second connection terminals and connection lines according to some embodiments of the present disclosure.
Figure 8D:
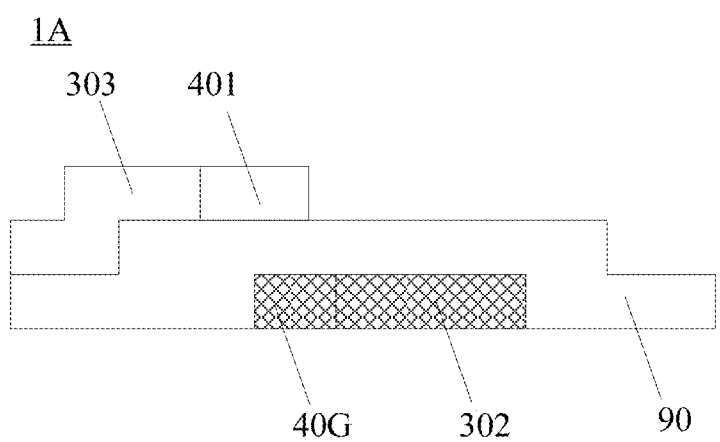
FIG. 8(d) is a sectional view of FIG. 8(a) along an A-A' direction and close to the first electrode.
Figure 8E:
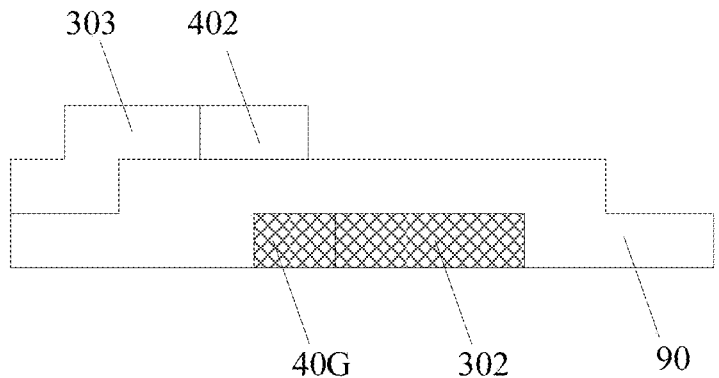
FIG. 8(e) is a sectional view of FIG. 8(a) along an A-A' direction and close to the second electrode.
Figure 8F:
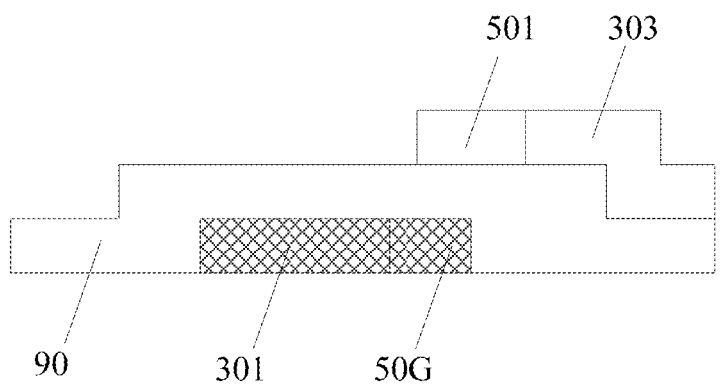
FIG. 8(f) is a sectional view of FIG. 8(c) along an A-A' direction and close to the first electrode.
Figure 8G:
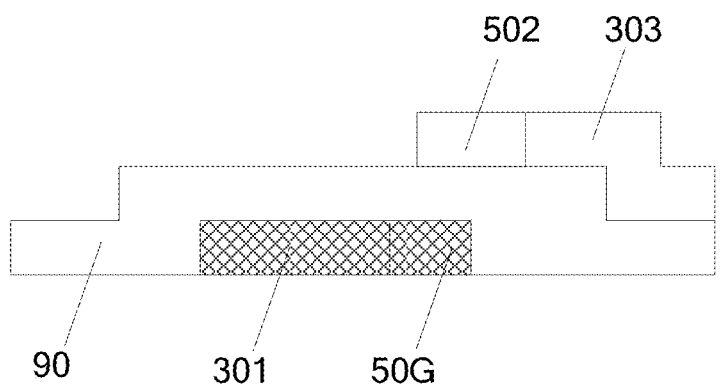
FIG. 8(g) is a sectional view of FIG. 8(c) along an A-A' direction and close to the second electrode.

The first connection sub-line 301 and the second connection sub-line 302 are disposed in a same layer as the at least one gate line 70, and the third connection sub-line 303 is disposed in a same layer as the at least one first metal line 80, that is, the first connection sub-line 301, the second connection sub-line 302 are disposed in a different layer from the third connection sub-line 303. Therefore, in some embodiments, as shown in FIG. 7(b), the array substrate 1A further includes an insulating layer 90 disposed between the first and second connection sub-line 301, 302 and the third connection sub-line 303.

Here, since the first connection sub-line 301 and the second connection sub-line 302 are disposed in a same layer as the at least one gate line 70, and the third connection sub-line 303 is disposed in a same layer as the at least one first metal line 80, in some examples, the insulating layer disposed between the first and second connection sub-line 301, 302 and the third connection sub-line 303, and the insulating layer disposed between the first metal line 80 and the gate line 70 are connected together to form a whole layer.

Since the first connection sub-line 301 and the second connection sub-line 302 are disposed in a different layer from the third connection sub-line 303, and the at least one first connection terminal 10, the at least one second connection terminal 20 and the third connection sub-line 303 are all disposed at a side of the insulating layer 90 away from the base substrate 100, the first connection sub-line 301 and the second connection sub-line 302 are both disposed at an opposite side of the insulating layer 90 close to the base substrate 100.

Therefore, in order to achieve electrical connection between the structures on both sides of the insulating layer 90, in some embodiments, as shown in FIG. 7(*b*), each of the at least one first connection terminal 10 is connected to a corresponding first connection sub-line 301 below by passing through at least one first via hole 91 formed in the insulating layer 90; each of the at least one second connection terminal 20 is connected to a corresponding second connection sub-line 302 below by passing through at least one second via hole 92 formed in the insulation layer 90; the third connection sub-line 303 is connected to a corresponding first connection sub-line 301 below by passing through at least one third via hole 93 formed in the first insulating layer 90, and the third connection sub-line 303 is also connected to a corresponding second connection sub-line 302 below by passing through at least one fourth via hole 94 formed in the first insulating layer 90.

In this way, signal transmission between the first connection terminal 10 and the second connection terminal 20 is achieved via the connection line 30 designed as a jumper wire.

Thus, in order to achieve electrical connection between a first connection terminal 10 and a corresponding first connection sub-line 301, the first connection terminal 10 is connected with the corresponding first connection sub-line 301 by passing through at least one first via hole 91 formed in the insulating layer 90, thereby the first connection terminal 10 is ensured to be electrically connected to the corresponding connection line 30 including the first connection sub-line 301, and the first connection terminal 10 is prevented from being connected to an adjacent connection line 30 due to the offset.

Similarly, in order to achieve electrical connection between a second connection terminal 20 and a corresponding second connection sub-line 302, the second connection terminal 20 is connected with the corresponding second connection sub-lines 302 by passing through at least one second via hole 92 formed in the insulating layer 90, thereby the second connection terminal 20 is ensured to be electrically connected to the corresponding connection line 30 including the second connection sub-line 302, and the second connection terminal 20 is prevented from being connected to an adjacent connection line 30 due to the offset. On this basis, a corresponding signal is ensured to be input to the second connection terminal 20.

In some embodiments, as shown in FIG. 8(*a*), the array substrate 1A further includes at least one first thin film transistor 40 disposed at a junction of the second connection sub-line 302 and the third connection sub-line 303. As shown in FIG. 8(*d*) and FIG. 8(*e*), a gate 40G of each of the at least one first thin film transistor 40 is connected with a corresponding second connection sub-line 302, and a first electrode 401 and a second electrode 402 of each of the at least one first thin film transistor 40 are connected with a corresponding third connection sub-line 303.

Alternatively, as shown in FIG. 8(*b*), the array substrate 1A further includes at least one first thin film transistor 40 disposed at a junction of the second connection sub-line 302 and the third connection sub-line 303, and at least one second thin film transistor 50 disposed at a junction of the first connection sub-line 301 and the third connection sub-line 303. As shown in FIG. 8(*d*) and FIG. 8(*e*), a gate 40G of each of the at least one first thin film transistor 40 is connected with a corresponding second connection sub-line 302, and a first electrode 401 and a second electrode 402 of each of the at least one first thin film transistor 40 are connected with a corresponding third connection sub-line 303. As shown in FIG. 8(*f*) and FIG. 8(*g*), a gate 50G of each of the at least one second thin film transistor 50 is connected with a corresponding first connection sub-line 301, and a first electrode 501 and a second electrode 502 of each of the at least one second thin film transistor 50 are connected with a corresponding third connection sub-line 303.

Still alternatively, as shown in FIG. 8(*c*), the array substrate 1A further includes at least one second thin film transistor 50 disposed at a junction of the first connection sub-line 301 and the third connection sub-line 303. As shown in FIG. 8(*e*), a gate 50G of each of the at least one second thin film transistor 50 is connected with the first connection sub-line 301, and a first electrode 501 and a second electrode 502 of each of the at least one second thin film transistor 50 are connected with a corresponding third connection sub-line 303.

The at least one first thin film transistors 40 includes one, two or more first thin film transistors 40. That is, one or two or more first thin film transistors 40 may be disposed at the junction of a second connection sub-line 302 and a third connection sub-line 303. Similarly, the at least one second thin film transistors 50 includes one, two or more second thin film transistors 50. That is, one or two or more second thin film transistors 50 may be disposed at the junction of a first connection sub-line 301 and a third connection sub-line 303.

The first and second electrodes of each of the at least one first thin film transistor 40 are not limited herein. For example, the first electrode is a source and the second electrode is a drain. In some other examples, the first electrode is a drain and the second electrode is a source.

Similarly, the first and second electrodes of each of the at least one second thin film transistor 50 are not limited herein. For example, the first electrode is a source and the second electrode is a drain. In some other examples, the first electrode is a drain and the second electrode is a source.

Moreover, the types of the first thin film transistor 40 and the second thin film transistor 50 are not limited herein. For example, the first thin film transistor 40 and the second thin film transistor 50 are any one of an amorphous silicon thin film transistor, a low temperature poly-silicon (LTPS) thin film transistor, a metal oxide thin film transistor, and an organic thin film transistor. Furthermore, the type of the first thin film transistor 40 and the type of the second thin film transistor 50 may be the same or different.

For example, materials of gate insulating layers of the first thin film transistor 40 and the second thin film transistor 50 are at least one of silicon oxide ($SiO_x$), silicon nitride ($SiN_x$) or silicon oxynitride ($SiO_xN_y$). Therefore, the gate insulating layer is also called a gate oxide layer.

Hereinafter, the first thin film transistor 40 will be taken as an example to describe its function in detail.

After the flexible circuit board inputs a signal to the second connection terminal 20, a corresponding second connection sub-line 302 electrically connected with the second connection terminal 20 transmits the signal to a corresponding third connection sub-line 303. As can be seen from the above description, the second connection sub-line 302 is electrically connected with the third connection sub-line 303. Therefore, whether the first thin film transistor 40 is turned on or not does not affect the transmission of the signal, that is, the first thin film transistor 40 is not used for the turn-on operation.

Thus, when the signal output by the flexible circuit board is a large current, the voltage on the second connection sub-line 302 is also instantaneously increased, and the breakdown first occurs to the gate insulating layer of the first thin film transistor 40 due to the instantaneously increased voltage, thereby the large current is intercepted by the first thin film transistor 40.

In the related art, when a large current output from the flexible circuit board is input to the connection line 30', only the connection line 30' loads the large current. If the current is too large, the heating power of the connection line 30' will rise remarkably, so as to increase the risk of burning the line.

By contrast, in the embodiments of the present disclosure, the at least one first thin film transistor 40 is disposed at the junction of the second connection sub-line 302 and the third connection sub-line 303. Thus, after the large current from the flexible circuit board is input to the connection line 30, the large current is first loaded by the at least one first thin film transistor 40, which shares a part of the current, thereby reducing the charge accumulation on the connection line 30 caused by transmission of an extremely large current, and reducing the heating power at turning or narrow positions of the connection line 30. Moreover, after the breakdown occurs to the gate insulation layer due to the instantaneously transmitted large current, the large current will be lowered, which will reduce the risk of burning the connection line 30.

Similarly, the function of disposing the at least one second thin film transistor 50 at the junction of the first connection sub-line 301 and the third connection sub-line 303 is also to divert a part of the current of the connection line 30. When the breakdown occurs to the gate insulating layer due to the large current instantaneously transmitted on the connection line 30, the second thin film transistor 50 may buffer the large current to prevent the connection line 30 from being burnt out due to excessive current. For the specific principle, please refer to the above description, and it will not be elaborated here.

In some embodiments, the first thin film transistor 40 is a large-sized thin film transistor, that is, the first thin film transistor 40 has a large width to length ratio (W/S). The distance between the first electrode (e.g. the source) and the second electrode (e.g. the drain) of the first thin film transistor 40 is generally referred to as a channel length (S), and widths (W) of the first electrode and the second electrode are perpendicular to a direction of S. A value of the above W/S refers to the width to length ratio of the channel (i.e. an aspect ratio). Exemplarily, the width to length ratio of the first thin film transistor is 20:7.5.

In some embodiments, the second thin film transistor 50 is a large-sized thin film transistor, that is, the second thin film transistor 50 has a large width to length ratio (W/S). The distance between the first electrode (e.g. the source) and the second electrode (e.g. the drain) of the second thin film transistor 50 is generally referred to as a channel length (S), and widths (W) of the first electrode and the second electrode are perpendicular to a direction of S. A value of the above W/S refers to the width to length ratio of the channel (i.e. the aspect ratio). Exemplarily, the width to length ratio of the second thin film transistor is 20:7.5.

In some embodiments, the first thin film transistor 40 and the second thin film transistor 50 are both large-sized thin film transistors. For the related content, please refer to the above description, and it will not be elaborated here. Moreover, exemplarily, the width to length ratios of the first thin film transistor 40 and the second thin film transistor 50 are both 20:7.5.

Figure 9:
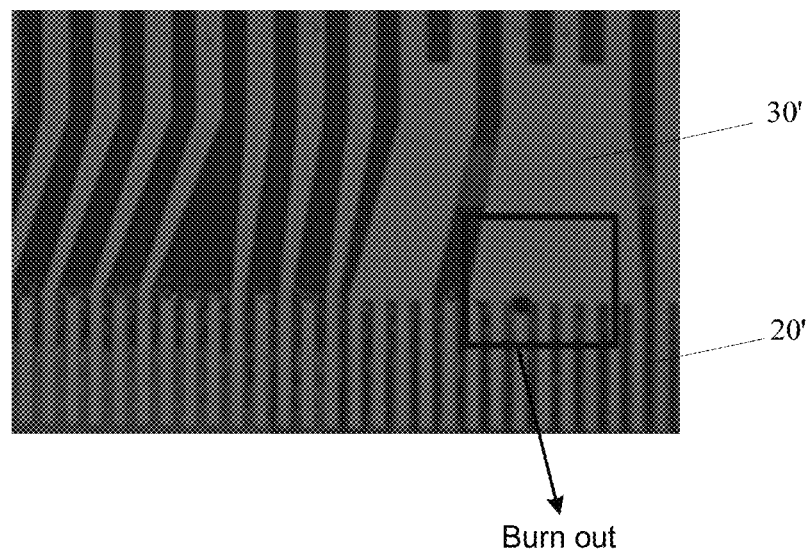
FIG. 9 is a schematic diagram illustrating that a second connection terminal is burnt out according to some embodiments of the present disclosure.

Since the width of the second connection terminal 20 is narrow, a large connection resistance is generated between the second connection terminal 20 and the connection line 30. Thus, when an abnormally large current is transmitted to the second connection terminal 20, as shown in FIG. 9, the second connection terminal 20 will generate a large heating power, and a part of the second connection terminal 20 may be burnt out due to the heat generated on it. In particular, a junction between the second connection terminal 20 and the connection line 30 is more likely to be burnt out.

Figure 10A:
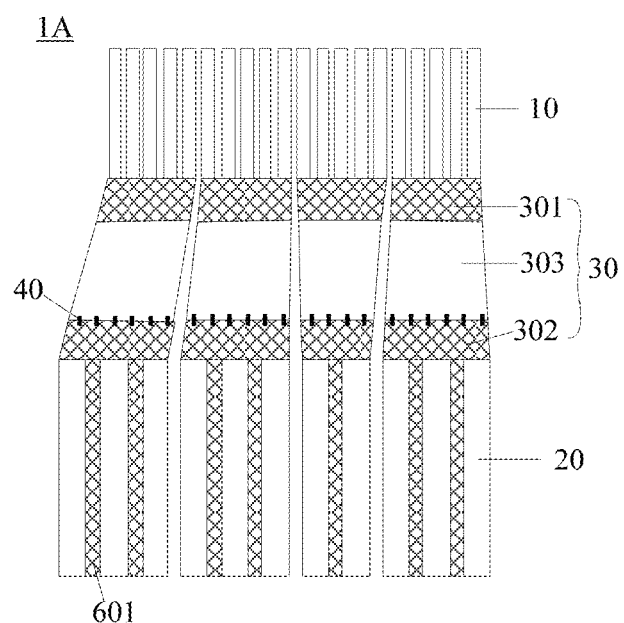
FIG. 10(a) is a schematic diagram illustrating yet still another connection structure of first connection terminals, second connection terminals and connection lines according to some embodiments of the present disclosure.

With regard to the above problem, in some embodiments, as shown in FIG. 10(*a*), the array substrate 1A further includes at least one first connection strip 601 disposed on the base substrate 100 and located in the non-display area 02 of the array substrate 1A. The at least one second connection terminal 20 includes at least two second connection terminals 20. Each of the at least one first connection strip 601 is disposed between two adjacent second connection terminals 20 that transmit a same signal among the at least two second connection terminals 20, and each of the at least one first connection strip 601 is in contact with the two adjacent second connection terminals 20.

In some examples, the at least two second connection terminals 20 includes a plurality of second connection terminals 20 connected with a same connection line 30, and the signals transmitted by the plurality of second connection terminals 20 connected with the same connection line 30 are the same. For example, as shown in FIG. 10(*a*), two or three second connection terminals 20 connected to the same connection line 30 transmit a same signal which is then transmitted to the same connection line 30.

In this way, since among the plurality of second connection terminals 20 for transmitting a same signal, two adjacent second connection terminals 20 are connected via a first connection strip 601, the current passing through each connection terminal 20 may be decreased. Therefore, by contrast with the related art in which the plurality of second connection terminals 20' connected to a same connection line 30' are set independently as shown in FIG. 1, in the embodiments of the present disclosure, when an abnormally large current is transmitted to the second connection terminals 20 in the array substrate 1A, the first connection strip 601 may reduce the heating power of the second connection terminals 20 connected with the first connection strip 601, thereby reducing the risk of burning the second connection terminals 20 under a large current.

In some embodiments, as shown in FIG. 10(*b*), the array substrate 1A further includes at least one second connection strip 602 disposed on the base substrate 100 and located in the non-display area 02 of the array substrate 1A. The at least one first connection terminal 10 includes at least two first connection terminals 10. Each of the at least one second connection strip 602 is disposed between two adjacent first connection terminals 10 that transmit a same signal among the at least two first connection terminals 10, and each of the at least one second connection strip 602 is in contact with the two adjacent first connection terminals 10.

Figure 10B:
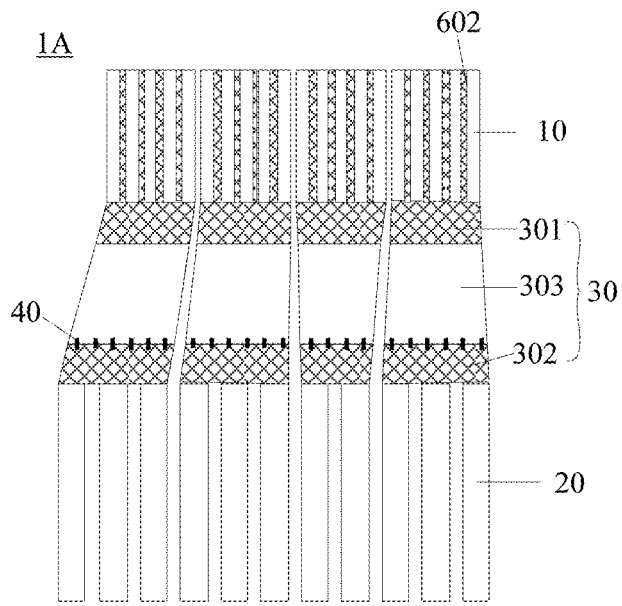
FIG. 10(b) is a schematic diagram illustrating yet still another connection structure of first connection terminals, second connection terminals and connection lines according to some embodiments of the present disclosure.

In some examples, the at least two first connection terminals 10 includes a plurality of first connection terminals 10 connected with a same connection line 30, and the signals transmitted by the plurality of first connection terminals 10 connected with the same connection line 30 are the same. For example, as shown in FIG. 10(b), the five first connection terminals 10 connected to the same connection line 30 transmit a same signal from the same connection line 30.

In this way, since among the plurality of first connection terminals 10 for transmitting a same signal, two adjacent first connection terminals 10 are connected via a second connection strip 602, the current passing through each first connection terminal 10 may be reduced. Therefore, by contrast with the related art in which the plurality of first connection terminals 10' connected to a same connection line 30' are set independently as shown in FIG. 1, in the embodiments of the present disclosure, after an abnormally large current is transmitted to the second connection terminals 20 in the array substrate 1A, the large current is transmitted to the connection line 30 connected with the second connection terminals 20, and the second connection strip 602 may reduce the heating power of the first connection terminals 10 connected with the connection line 30, thereby reduces the risk of burning the first connection terminals 10 under a large current.

Figure 10C:
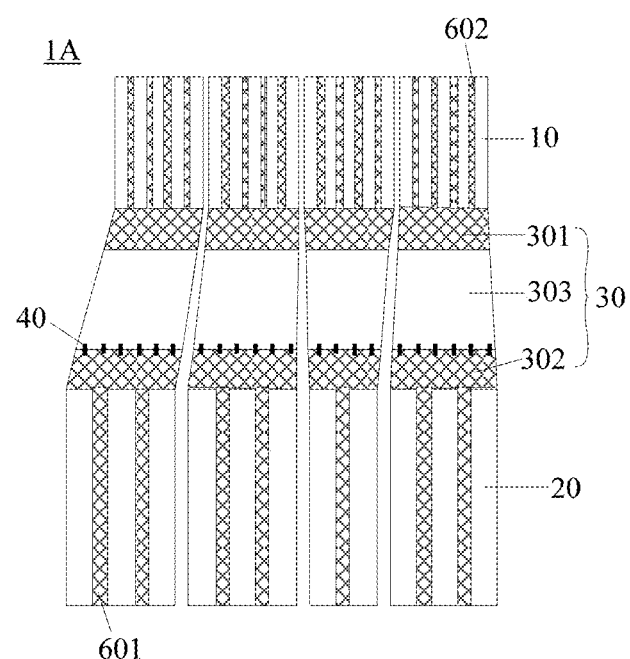
FIG. 10(c) is a schematic diagram illustrating yet still another connection structure of first connection terminals, second connection terminals and connection lines according to some embodiments of the present disclosure.

In some embodiments, as shown in FIG. 10(c), the array substrate 1A further includes at least one first connection strip 601 disposed on base substrate 100 and located in the non-display area 02 of the array substrate 1A, and at least one second connection strip 602 disposed on the base substrate 100 and located in the non-display area 02 of the array substrate 1A. The at least one second connection terminal 20 includes at least two second connection terminals 20, and the at least one first connection terminal 10 includes at least two first connection terminals 10. Each of the at least one first connection strip 601 is disposed between two adjacent second connection terminals 20 that transmit a same signal among the at least two second connection terminals 20, and is in contact with the two adjacent second connection terminals 20. Each of the at least one second connection strip 602 is disposed between two adjacent first connection terminals 10 that transmit a same signal among the at least two first connection terminals 10, and is in contact with the two adjacent first connection terminals 10.

For the functions of the first connection strip 601 and the second connection strip 602, please refer to the above description, and they will not be elaborated here.

In some embodiments, in a case where the array substrate 1A further includes at least one first connection strip 601, each of the at least one second connection terminal 20 includes at least one layer in a thickness direction, and the at least one first connection strip 601 and at least one layer of each second connection terminal 20 are disposed in a same layer, and are made of a same material. In this way, the at least one first connection strip 601 may be fabricated simultaneously with one or two or more layers in each second connection terminal 20 to simplify the fabricating process of the array substrate 1A.

For example, the at least one first connection strip 601 and one layer of the second connection terminal 20 are disposed in a same layer and made of a same material. Exemplarily, the second connection terminal 20 is of a three-layer structure, and the at least one first connection strip 601 is fabricated simultaneously with a first layer of the second connection terminal 20. Alternatively, the at least one first connection strip 601 and two or more layers of the second connection terminal 20 are disposed in same layers respectively, and made of same materials respectively. In this case, the first connection strip 601 is composed of multiple layers.

In some embodiments, in a case where the array substrate 1A further includes at least one second connection strip 602, each of the at least one first connection terminal 10 includes at least one layer in a thickness direction, and the at least one second connection strip 602 and at least one layer in each first connection terminal 10 are disposed in a same layer, and are made of a same material. In this way, the at least one second connection strip 602 may be fabricated simultaneously with one or two or more layers in each first connection terminal 10 to simplify the fabricating process of the array substrate 1A.

For example, the at least one second connection strip 602 and one layer of the first connection terminal 10 are disposed in a same layer, and made of a same material. Exemplarily, the first connection terminal 10 is of a three-layer structure, and the second layer 602 is fabricated simultaneously with a first layer of the first connection terminal 10. Alternatively, the second connection strip 602 and two or more layers of the first connection terminal 10 are disposed in same layers respectively, and made of same materials respectively. In this case, the second connection strip 602 is composed of two or more layers.

In some embodiments, in a case where the array substrate 1A further includes at least one first connection strip 601 and at least one second connection strip 602, each of the at least one second connection terminal 20 includes at least one layer in a thickness direction, and the at least one first connection strip 601 and at least one layer of each second connection terminal 20 are disposed in a same layer, and are made of a same material. Each of the at least one first connection terminal 10 includes at least one layer in a thickness direction, and the at least one second connection strip 602 and at least one layer of each first connection terminal 10 are disposed in a same layer, and are made of a same material.

In this way, the at least one first connection strip 601 may be fabricated simultaneously with one or two or more layers in each second connection terminal 20, and at least one second connection strip 602 may be fabricated simultaneously with one or two or more layers in each first connection terminal 10 to simplify the fabrication process of the array substrate 1A.

Some embodiments of the present disclosure provide a display device 2A. As shown in FIG. 11, the display device 2A includes an IC (labelled as "IC" in FIG. 11), a flexible circuit board 1B, and the array substrate 1A described above. The IC is connected with the at least one first connection terminal 10, and the flexible circuit board 1B is connected with the at least one second connection terminal 20.

The type of the display device 2A is not limited herein. For example, the display device 2A is a liquid crystal display device or an organic electroluminescence display device. In some other examples, the display device is a low temperature poly-silicon display device or another type of display device.

The display device 2A according to the embodiments of the present disclosure includes the array substrate 1A described above, in which the at least one first connection terminal 10 and the at least one second connection terminal 20 of the array substrate 1A are connected with the at least one connection line 30. The resistivity of at least a part of each of at least one of the at least one connection line 30 is less than that of the gate line 70 located in the display region 01, that is, the resistivity of at least a part of each of at least one of the connection line 30 is less than the resistivity of the gate line 70. Therefore, when a large current passes through the connection line 30, compared with the setting in the related art in which the connection line and the gate line are disposed in a same layer and are made of a same material, the heating power of the connection line 30 in the array substrate 1A according to the embodiments of the present disclosure is relatively small. This reduces the risk of burning the connection line 30 under a large current, and prevents the display device from malfunctioning.

In some embodiments, the display device is a display panel.

The display device may be any device that displays an image, no matter whether the image is moving (e.g. a video) or fixed (e.g. a still image), and whether it is a text or a picture. It is expected that the embodiments may be implemented in or associated with a variety of electronic devices including (but not limited to), for example, mobile phones, wireless devices, PADs (portable android device), handheld or portable computers, GPS (Global Positioning System) receivers/navigators, cameras, MP4 (full name MPEG-4 Part 14) video players, video cameras, game consoles, watches, clocks, calculators, television monitors, flat panel displays, computer monitors, car displays (e.g. odometer displays), navigators, cockpit controls and/or displays, monitors of camera views (e.g. a rear view camera display in vehicles), electronic photos, electronic billboards or signage, projectors, building structures, a packages, and aesthetic structures (e.g. a display for an image of a piece of jewelry).

The above embodiments are merely some embodiments of the present disclosure, but the protection scope of the present disclosure is not limited thereto. Any person skilled in the art could readily conceive of changes or replacement within the technical scope of the present disclosure, which shall all be included in the protection scope of the present disclosure. Therefore, the protection scope of the present disclosure shall be determined by the protection scope of the claims.

What is claimed is:

1. An array substrate, comprising:
   a base substrate;
   at least one first connection terminal, at least one second connection terminal, and at least one connection line, which are disposed on the base substrate and located in a non-display area of the array substrate, the at least one connection line being connected with the at least one first connection terminal and the at least one second connection terminal;
   at least one gate line disposed on the base substrate and located in a display area of the array substrate, and
   at least one first metal line disposed on the base substrate and located in the display area of the array substrate, wherein
   the at least one first connection terminal is configured to connect with an integrated circuit (IC);
   the at least one second connection terminal is configured to connect with a flexible circuit board;
   a resistivity of at least a part of each of at least one of the at least one connection line is less than a resistivity of the at least one gate line, and a resistivity of the at least one first metal line is less than a resistivity of the at least one gate line;
   each of the at least one connection line comprises a first connection sub-line, a third connection sub-line and a second connection sub-line electrically connected in sequence, the first connection sub-line is electrically connected with corresponding one or more first connection terminals of the at least one first connection terminal, and the second connection sub-line is electrically connected with corresponding one or more second connection terminals of the at least one second connection terminal; and
   the first connection sub-line, the second connection sub-line and the at least one gate line are disposed in a same layer, and are made of a same material; the third connection sub-line and the at least one first metal line are disposed in a same layer, and are made of a same material.

2. The array substrate according to claim 1, wherein
   the array substrate further comprises an insulating layer disposed between the first and second connection sub-lines and the third connection sub-line;
   the at least one first connection terminal, the at least one second connection terminal and the third connection sub-line are all located at a side of the insulating layer away from the base substrate; the first connection sub-line and the second connection sub-line are both located at an opposite side of the insulating layer close to the base substrate; wherein,
   each of the at least one first connection terminal is connected to a corresponding first connection sub-line by passing through at least one first via hole formed in the insulation layer;
   each of the at least one second connection terminal is connected to a corresponding second connection sub-line by passing through at least one second via hole formed in the insulation layer;
   the third connection sub-line is connected to a corresponding first connection sub-line by passing through at least one third via hole formed in the insulation layer; and the third connection sub-line is connected to a corresponding second connection sub-line by passing through at least one fourth via hole formed in the insulation layer.

3. The array substrate according to claim 2, further comprising at least one of:
   at least one first thin film transistor disposed at a junction of the second connection sub-line and the third connection sub-line, or, at least one second thin film transistor disposed at a junction of the first connection sub-line and the third connection sub-line,
   wherein a gate of each first thin film transistor is connected to a corresponding second connection sub-line, and a first electrode and a second electrode of each first thin film transistor are connected to a corresponding third connection sub-line;
   wherein a gate of each second thin film transistor is connected to a corresponding first connection sub-line, and a first electrode and a second electrode of each second thin film transistor are connected to a corresponding third connection sub-line.

4. The array substrate according to claim 3, wherein a width to length ratio of each of at least one of the at least one first thin film transistor is 20:7.5.

5. The array substrate according to claim 3, wherein, a width to length ratio of each of at least one of the at least one second thin film transistor is 20:7.5.

6. The array substrate according to claim 1, further comprising at least one of:
   at least one first connection strip disposed on the base substrate and located in the non-display area of the array substrate; or, at least one second connection strip disposed on the base substrate and located in the non-display area of the array substrate,
   wherein the at least one second connection terminal comprises at least two second connection terminals, each first connection strip is disposed between two adjacent second connection terminals that transmit a same signal among the at least two second connection terminals, and each first connection strip is in contact with both of corresponding two adjacent second connection terminals;

wherein the at least one first connection terminal comprises at least two first connection terminals, each second connection strip is disposed between two adjacent first connection terminals that transmit a same signal among the at least two first connection terminals, and each second connection strip is in contact with both of corresponding two adjacent first connection terminals.

7. The array substrate according to claim 6, wherein in a case where the array substrate further comprises the at least one first connection strip, each second connection terminal comprises at least one layer in a thickness direction, and the at least one first connection strip and at least one layer of each second connection terminal are disposed in a same layer, and are made of a same material.

8. The array substrate according to claim 1, wherein at least one whole connection line of the at least one connection line, and the at least one first metal line are disposed in a same layer and are made of a same material.

9. The array substrate according to claim 8, further comprising an insulating layer disposed on the base substrate and located in the non-display area, wherein
the at least one first connection terminal and the at least one second connection terminal are both located at a side of the insulating layer, and the at least one connection line is located at an opposite side of the insulating layer;
each of the at least one first connection terminal is connected to a corresponding connection line by passing through at least one fifth via hole formed in the insulation layer, and each of the at least one second connection terminal is connected to a corresponding connection line by passing through at least one sixth via hole formed in the insulation layer.

10. The array substrate according to claim 9, wherein, the at least one first connection terminal and the at least one second connection terminal are both located at a side of the insulation layer away from the base substrate, and the at least one connection line is located at an opposite side of the insulation layer close to the base substrate.

11. The array substrate according to claim 1, wherein each first metal line is a data line or a common electrode line.

12. The array substrate according to claim 1, wherein
each first metal line has a laminated structure and comprises at least two layers along a thickness direction, and the at least two layers comprises a layer of Al, and a layer of Ti;
a material of each gate line is Mo.

13. The array substrate according to claim 12, wherein each first metal line comprises a three-layer structure, a material of a middle layer among the three-layer structure is Al, and materials of two layers in the three-layer structure located at two sides of the middle layer are both Ti.

14. A display device, comprising:
an integrated circuit (IC);
a flexible circuit board; and
the array substrate according to claim 1, wherein
the IC is connected to the at least one first connection terminal of the array substrate, and the flexible circuit board is connected to the at least one second connection terminal of the array substrate.

15. The array substrate according to claim 6, wherein in a case where the array substrate further comprises the at least one second connection strip, each second connection terminal comprises at least one layer in a thickness direction, and the at least one second connection strip and at least one layer of each second connection terminal are disposed in a same layer, and are made of a same material.

* * * * *